United States Patent
Sakamoto et al.

(10) Patent No.: US 7,662,694 B2
(45) Date of Patent: Feb. 16, 2010

(54) CAPACITOR HAVING ADJUSTABLE CAPACITANCE, AND PRINTED WIRING BOARD HAVING THE SAME

(75) Inventors: Hajime Sakamoto, Ogaki (JP); Takashi Kariya, Ogaki (JP); Yasuhiko Mano, Ogaki (JP)

(73) Assignee: Ibiden Co., Ltd., Ogaki (JP)

( * ) Notice: Subject to any disclaimer, the term of this patent is extended or adjusted under 35 U.S.C. 154(b) by 292 days.

(21) Appl. No.: 11/495,668

(22) Filed: Jul. 31, 2006

(65) Prior Publication Data

US 2008/0024953 A1    Jan. 31, 2008

(51) Int. Cl.
*H01L 21/20* (2006.01)
*H01L 21/02* (2006.01)
*H01G 4/005* (2006.01)

(52) U.S. Cl. .................. 438/389; 438/386; 438/398; 438/399; 361/292; 361/298.2; 361/299.4; 361/303; 257/303; 257/306; 257/309; 257/E21.008; 257/E21.013

(58) Field of Classification Search .............. 438/386, 438/389, 398, 399; 361/277, 278, 292, 298.2; 257/308, 309
See application file for complete search history.

(56) References Cited

U.S. PATENT DOCUMENTS 5,164,881 A * 11/1992 Ahn .................... 361/313
6,375,823 B1    4/2002 Matsuda et al.

FOREIGN PATENT DOCUMENTS

| JP | 10-303062 | 11/1998 |
|----|-----------|---------|
| JP | 2000-232078 | 8/2000 |
| JP | 2000-340454 | 12/2000 |

* cited by examiner

*Primary Examiner*—Dao H Nguyen
(74) *Attorney, Agent, or Firm*—Oblon, Spivak, McClelland, Maier & Neustadt, L.L.P.

(57) ABSTRACT

The capacitance of a capacitor is adjusted by forming openings in one of a pair of electrodes of the capacitor, the openings having different sizes d1, d2, d3, . . . , wherein d1>d2>d3> . . . and being arranged in numbers n1, n2, n3, . . . , respectively; and sequentially filling a necessary number of the openings with an electroconductive material in descending order of the size so as to adjust the capacitance gradually with an increasing degree of precision. The resulting capacitor is mounted to a printed wiring board.

9 Claims, 9 Drawing Sheets

30-1(FILLED)  30-1(OPEN)    30-2(OPEN)
  φ20μm × 20              φ10μm × 20

(a)

(b)

(c)

(d)

CAPACITOR HAVING ADJUSTABLE CAPACITANCE, AND PRINTED WIRING BOARD HAVING THE SAME

BACKGROUND OF THE INVENTION

1. Field of the Invention

The present invention relates to capacitors having adjustable capacitance, and printed wiring boards having the capacitors.

2. Description of the Related Art

Printed wiring boards are originally used for mechanically holding electronic components such as semiconductor devices, for feeding these electronic components, and for establishing electric interconnections between the electronic components. The printed wiring boards therefore comprise, for example, land, pad, and through-hole conductors for mechanically holding the electronic components; wiring pattern conductors, via-hole conductors, and through-hole conductors for feeding them and establishing electric interconnection of them; and dielectric layers for mechanically holding these land, pad, and through-hole conductors, via-hole conductors, and wiring pattern conductors.

Printed wiring boards embedded resistor, inductor and/or capacitor components therein have been proposed for increasing the functions of such printed wiring boards and/or for reducing the number of surface mount electronic components.

The surface mounted components in package substrates for use in current electronic devices, however, must have performance with high precision as in individual components. For example, package substrates to be developed by the present inventors require a capacitance precision of the capacitor within about ±5%. The term "package substrate" used herein means a printed wiring board on which one or more electronic components were mounted.

The present inventors have found the following patent documents in this field: Japanese Patent Laid-open Publication No. 10-303062, entitled "Trimmable Capacitor" published on Nov. 13, 1998; and Japanese Patent Laid-open Publication No. 2000-340454, entitled "Method and Apparatus for Adjusting Capacitance" published on Dec. 8, 2000.

Japanese Patent Laid-open Publication No. 10-303062 discloses a method of adjusting the capacitance of a capacitor by constituting trimmable electrodes from an electroconductive material and a dielectric material that can have electroconductivity upon heating; imparting electroconductivity to part of the dielectric material by laser irradiation to thereby increase the electrode area; and trimming part of the electroconductive material to thereby reduce the electrode area.

Japanese Patent Laid-open Publication No. 2000-340454 discloses a method of adjusting the capacitance of a capacitor including a substrate and a pair of electrodes arranged on or above the substrate so as to face each other, in which the capacitance is adjusted by applying laser beams to one of the electrodes to form a trimming region having a predetermined area and a predetermined shape.

SUMMARY OF THE INVENTION

However, the present inventors found that the above-mentioned conventional methods of adjusting the capacitance have various problems caused by laser irradiation.

Accordingly, an object of the present invention is to provide a novel capacitor having an adjustable capacitance, and a method of fabricating the capacitor.

Another object of the present invention is to provide a novel printed wiring board including a capacitor having an adjustable capacitance, and a method of fabricating the printed wiring board.

In view of the above object, a capacitor of the present invention is that a capacitor having an adjustable capacitance and comprising a pair of electrodes, wherein one of the pair of electrodes has one or more openings for adjusting the capacitance.

Further a capacitor of the present invention is that a capacitor having an adjustable capacitance and comprising a pair of electrodes, wherein one of the pair of electrodes has an area adjacent to the electrode for adjusting the capacitance by adding an electroconductive material to the area.

As to the above capacitor, wherein the one or more openings may comprise two or more groups of the openings having different sizes.

As to the above capacitor, wherein the one or more openings may comprise groups n1, n2, n3, . . . , of the openings having different sizes d1, d2, d3, . . . .

Further a method of adjusting a capacitance of a capacitor of the present invention including a pair of electrodes, the method comprising the steps of: forming openings for adjusting the capacitance on one of the pair of electrodes, the openings comprise groups n1, n2, n3, . . . of the openings having different sizes d1, d2, d3, . . . ; and sequentially filling a necessary number of the openings with an electroconductive material in descending order of the size to thereby adjust the capacitance gradually with an increasing degree of precision.

As to the above method, wherein the step of filling may be gradually carried out while determining the capacitance of the resulting capacitor.

Further a printed wiring board of the present invention comprising at least one capacitor having an adjustable capacitance, wherein the at least one capacitor is the capacitor according to any one of Claims 1 to 6.

Further a method of fabricating a capacitor of the present invention having a pair of electrodes, the method comprising the steps of: forming one of the pair of electrodes; forming a dielectric layer on or above the one electrode; forming the other electrode on or above the dielectric layer; and increasing an effective area of the other electrode by applying an electroconductive material to the other electrode during the step of forming to other electrode, to thereby adjust the capacitance of the capacitor.

As to the above method, wherein the step of increasing the effective area may comprise the steps of: forming one or more openings on the other electrode; and filling a necessary number of the one or more openings with an electroconductive material.

As to the above method, wherein the step of increasing the effective area may comprises the steps of: forming openings in the other electrode, the openings having different sizes d1, d2, d3, . . . wherein d1>d2>d3> . . . and being arranged in numbers n1, n2, n3, . . . , respectively; and sequentially filling a necessary number of the openings with an electroconductive material in descending order of the size to thereby adjust the capacitance gradually to an increasing degree of precision.

Further a method of fabricating a capacitor of the present invention having an adjustable capacitance, comprising the steps of: preparing a core substrate; forming at least one dielectric layer on or above the core substrate, the dielectric layer having a conductive interconnection and a via hole conductor; and fabricating a capacitor by the above method, using the conductive interconnection as the one electrode.

The present invention can provide a novel capacitor having an adjustable capacitance, and a method of fabricating the capacitor.

In addition, the present invention can provide a novel printed wiring board including a capacitor having an adjustable capacitance, and a method of fabricating the printed wiring board.

Further objects, features and advantages of the present invention will become apparent from the following description of the preferred embodiments with reference to the attached drawing.

DESCRIPTION OF THE PREFERRED EMBODIMENTS

Figure 1A:
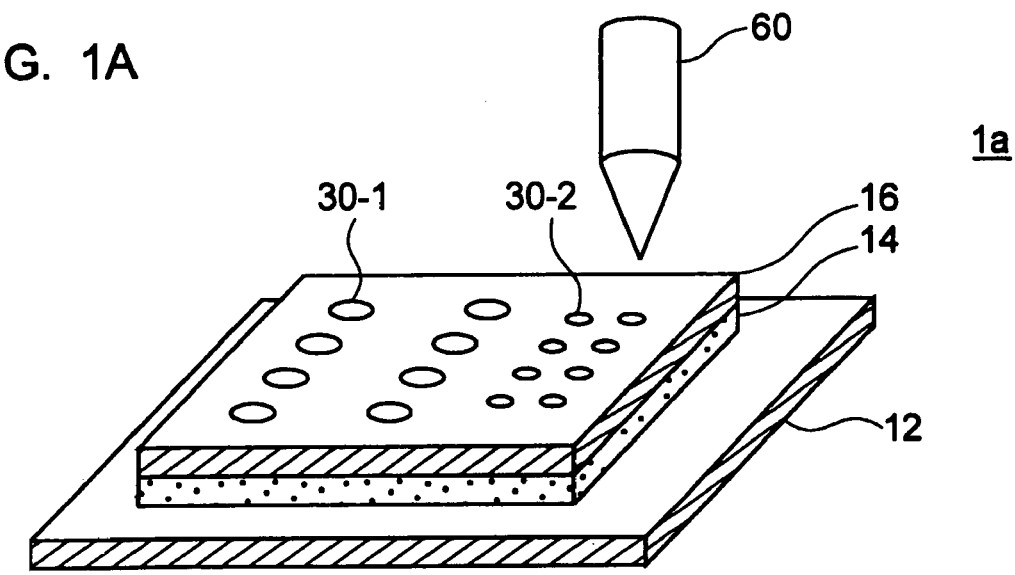
FIG. 1A shows a capacitor having an adjustable capacitance according to a first embodiment of the present invention.

Certain embodiments of the capacitors having an adjustable capacitance and printed wiring boards embedded therein these capacitors according to the present invention will be illustrated in detail below with reference to the attached drawings. In the drawings, identical elements have identical reference numerals, and overlapped descriptions will be omitted.

First Embodiment (Outlines)

FIG. 1A shows a capacitor having an adjustable capacitance according to a first embodiment of the present invention.

The capacitor 1a according to the first embodiment has an upper electrode 16 on which predetermined numbers of openings 30-1 and 30-2 having predetermined diameters are formed. The capacitance of the capacitor 1a is adjusted by filling a necessary number of the openings with an electroconductive material.

The capacitor 1a according to the first embodiment comprises the upper electrode 16, a lower electrode 12, and a dielectric layer 14 arranged between the two electrodes. The two electrodes 16 and 12 each comprise a metal layer. They preferably comprise, for example, a copper (Cu) layer. Materials for the dielectric layer 14 are commercially available typically as high-dielectric laminates and high-dielectric films. Examples thereof are the products of Matsushita Electric Works, Ltd. (Japan) under the model name of "High-Dk Capacitor Film", the product of Hitachi Chemical Co., Ltd. (Japan) under the model name of "ESP", the product of Minnesota Mining & Manufacturing (MN) under the model name of "C-Ply", the product of E.I. du Pont de Nemours and Company (DE) under the model name of "HiK", and the products of OAK-MITSUI (a Division of Mitsui Kinzoku; Japan) under the model name of "FaradFlex". These materials each have a relative dielectric constant $\in_r$ of about 5 to about 40. The dielectric layer 14 preferably has an area larger than that of the upper electrode 16; and the lower electrode 12 preferably has an area larger than that of the dielectric layer 14, for preventing a short circuit between the electrodes 16 and 12.

(Method of Adjusting Capacitance)

With reference to FIG. 1A, the upper electrode 16 of the capacitor 1a has plural numbers of openings 30-1 and 30-2 having different sizes. The capacitance of the capacitor 1a in this stage is determined using a measuring instrument such as the Impedance Analyzer Model E4991A or 4294A of Agilent Technologies Japan, Ltd. (Tokyo, Japan).

Then, an electroconductive material is discharged to some of the openings 30-1 and 30-2 of the upper electrode 16 by a discharger 60 to fill the openings with the electroconductive material to thereby increase the effective area of the upper electrode 16. The electroconductive material can be, for example, an electroconductive paste such as a copper (Cu) paste or silver (Ag) paste. The discharger 60 can be, for example, a jetting device for jetting an electroconductive material, such as a dispensing or ink-jet process.

Figure 1B:
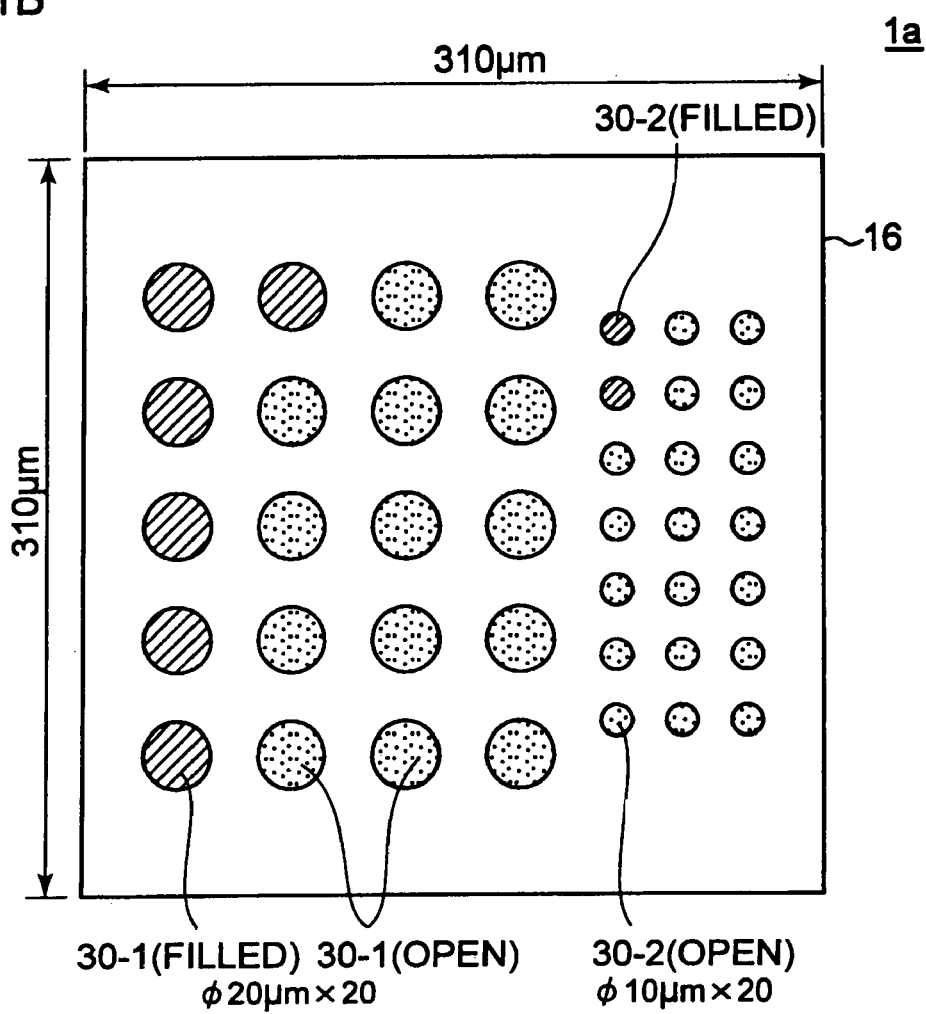
FIG. 1B shows an example of an upper electrode having openings of the capacitor according to a first embodiment.

FIG. 1B shows an embodiment of the upper electrode 16 on which the openings 30-1 and 30-2 are formed. In this embodiment, the upper electrode 16 is about 310 μm high and about 310 μm wide in outside dimension. The upper electrode 16 has the openings 30-1 each having a diameter of about 20 μm arranged in a number of five in height and four in width, a total of twenty; and the openings 30-2 each having a diameter of about 10 μm, smaller than that of the openings 30-1, arranged in a number of five in height and four in width, a total of twenty. It should be noted that they are merely exemplified and that the diameters and numbers of the openings 30-1 and 30-2 are not specifically limited to them.

Figure 2:
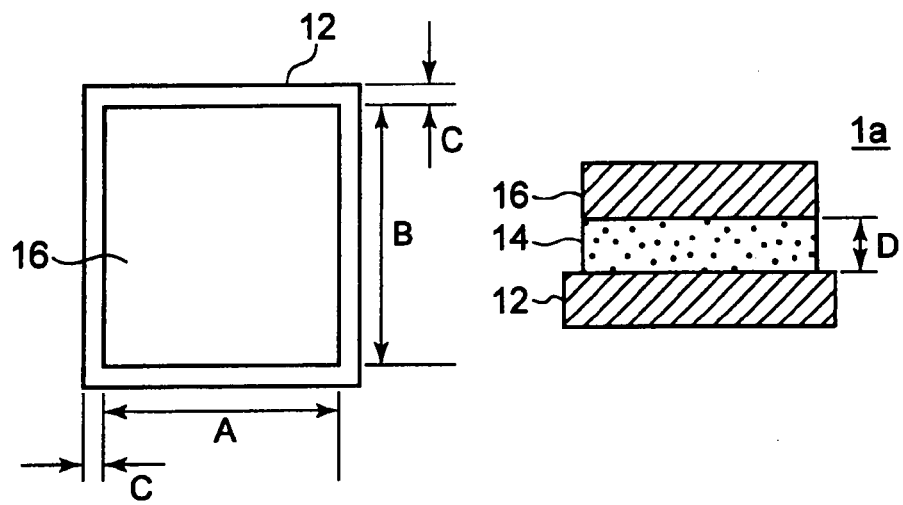
FIG. 2 shows how to calculate the capacitance of the capacitor according to the first embodiment.

FIG. 2 shows how to calculate the capacitance of the capacitor. The capacitance of the capacitor 1a is proportional to the relative dielectric constant $\in_r$ of the dielectric and the electrode area S, and inversely proportional to the distance D between the electrodes, as represented by the following Equation (1):

$$C = \in_0 \in_r S/D = 8.854 \times 10^{-12} \in_r \times (A \times B)/D \qquad (1)$$

wherein C represents the capacitance (F); $\in_0$ represents the dielectric constant of a vacuum (8.85 pF/m); $\in_r$ represents the relative dielectric constant of the dielectric (for example, $\in=22$); and S represents the area of the upper electrode, A×B (m²); and D represents the distance between the two electrodes (the thickness of the dielectric layer) (m).

With reference to Equation (1), the method for adjusting the capacitance of the capacitor 1a will be explained as an example.

Basically, the target capacitance of the capacitor Cspec. is set as a design specification and the target area of the upper electrode Sa that can realize the target capacitance Cspec. is determined by calculation. The upper electrode 16 is initially formed to have an apparent area Sb provided that all the opening are filled and an effective area Seff provided that all or some of the openings are open. The apparent area Sb initially formed is larger than the target area Sa of the upper electrode and the effective area Seff initially formed is smaller than the target area Sa of the upper electrode. The openings 30-1 and 30-2 are then filled with an electroconductive material one by one while measuring the capacitance. Thus, the openings 30-1 and 30-2 are made to be electroconductive one by one to constitute the upper electrode, so as to gradually increase the effective area Seff. and approach the target area of upper electrode Sa. The filling of the openings with the electroconductive material is completed at the time when the measured capacitance C stands nearest to the target capacitance of the capacitor Cspec.

The filling of the openings with the electroconductive material can be carried out by determining the increment in capacitance, and filling the openings 30-1 and 30-2 with the electroconductive material in one step so as to form the effective area Seff. of the upper electrode that can realize the increment in capacitance. Alternatively, it can be carried out by filling the openings with the electroconductive material in plural steps while measuring the resulting capacitance. Further alternatively, it can be carried out in combination with the measuremments of the capacitance.

The adjustment of the capacitance will be illustrated in detail with reference to the embodiment in FIG. 1B. Initially, the target capacitance Cspec. of the capacitor 1a is determined at, for example, 1.4609 pF. The dielectric constant ∈ (for example, ∈=22) and the thickness D (for example, D=12 µm) of the dielectric layer are set depending on the materials used and the method when the capacitor is made. In addition, the upper electrode 16 herein is square (A=B).

The required area Sa (=A×B) of the upper electrode 16 is determined by calculation under these conditions:

$$1.4609 \times 10^{-12} = 8.854 \times 10^{-12} \times 22 \times (A \times B)/(12 \times 10^{-6}) \quad (2)$$

According to this, A and B are each equal to 300 µm. Namely, the target capacitance Cspec. of 1.4609 (pF) can be achieved by forming the upper electrode 16 having the target area of upper electrode Sa of 300-µm square, as calculated according to Equation (1).

In an actual fabrication of a printed wiring board, the upper electrode 16 is preferably formed so as to have an area Sb of Ab×Bb of 310-µm square, slightly larger than Sa, and to have predetermined numbers of plural openings 30-1 and 30-2.

In this embodiment, the upper electrode 16 has the openings 30-1 each having a diameter of about 20 µm arranged in a number of five in height and four in width, a total of twenty; and the openings 30-2 each having a diameter of about 10 µm, smaller than that of the openings 30-1, arranged in a number of five in height and four in width, a total of twenty. The effective area Seff. except for the openings, and the capacitance C1 herein are determined by calculation as follows.

$$Seff.(m^2) = (310 \times 310 \times 10^{-12}) - (10 \times 10 \times 3.14 \times 10^{-12} \times 20) - (5 \times 5 \times 3.14 \times 10^{-12} \times 20) = 88.250 \times 10^{-12} \quad (3)$$

$$C1(pF) = 8.854 \times 10^{-12} \times 22 \times (Seff.)/(12 \times 10^{-6}) = 1.4325 \quad (4)$$

The capacitance C1 of the capacitor 1a decided by the upper electrode 16 having the effective area Seff. is slightly smaller than the target capacitance Cspec. The difference between them, i.e. ΔC=C−C1=0.0284 (pF), must be canceled by filling the openings with the electroconductive material.

When the openings having a diameter of 20 µm and a diameter of 10 µm, respectively, are filled with the electroconductive material, the increments C20 and C10 in capacitance are determined by calculation according to Equation (1), respectively.

$$C20 = 8.854 \times 10^{-12} \times 22 \times (10 \times 10 \times 10^{-12} \times 3.14)/(12 \times 10^{-6}) = 0.0050970(pF) \quad (5)$$

$$C10 = 8.854 \times 10^{-12} \times 22 \times (5 \times 5 \times 10^{-12} \times 3.14)(12 \times 10^{-6}) = 0.0012742(pF) \quad (6)$$

Specifically, the capacitance is roughly adjusted by filling the openings 30-1 having a diameter of 20 mm with the electroconductive material, and is finely or minutely adjusted by filling the openings 30-2 having a diameter of 10 µm. The capacitance ΔC=0.02803 (pF) can be increased by filling five of the openings 30-1 each having a diameter of 20 µm, and two of the openings 30-2 having a diameter of 10 m with the electroconductive material. As a result, the capacitance stands at C1+(C20×5+C10×2)=1.4605 (pF) with respect to the target capacitance Cspec.=1.4609 (pF). The precision of capacitance herein is 99.97% [={C1+(C20×5+C10×2)}/Cspec.] The filled openings 30-1 are indicated as "openings 31-1 (filled)", and the filled openings 30-2 are indicated as "openings 31-2 (filled)" in FIG. 1B.

The filling of the openings with the electroconductive material is preferably carried out while measuring the actual capacitance of the capacitor, because the calculated capacitance may differ from the actual (measured) capacitance due typically to various kinds of errors in fabrication.

It should be noted that the upper electrode 16 and the openings 30-1 and 30-2 arranged therein are illustrated merely by example. The capacitance may be adjusted by forming openings in the upper electrode 16, the openings having different sizes d1, d2, d3, . . . , wherein d1>d2>d3> . . . , and being arranged in numbers n1, n2, n3, . . . , respectively; and sequentially filling a necessary number of the openings with an electroconductive material in descending order of the diameter (size) so as to adjust the capacitance gradually to an increasing degree of precision. The term "openings having different sizes" herein is referred to as, but is not limited to, openings d2, d3, . . . , having diameters within 10% to 50% of that of the openings d1 having the largest diameter.

For the sake of simple and brief description, the openings herein are circle, but they can have any shapes and can be, for example, triangular or quadrangular.

(Method of Filling Openings with an Electroconductive Material)

Figure 3A:
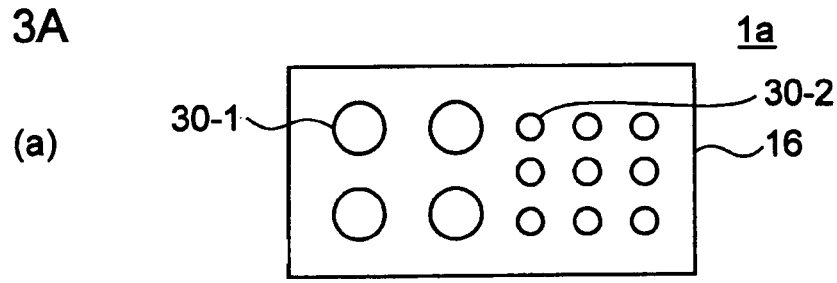
FIG. 3A shows how to fill the openings of the capacitor according to the first embodiment with an electroconductive material using sputtering.
Figure 3A:
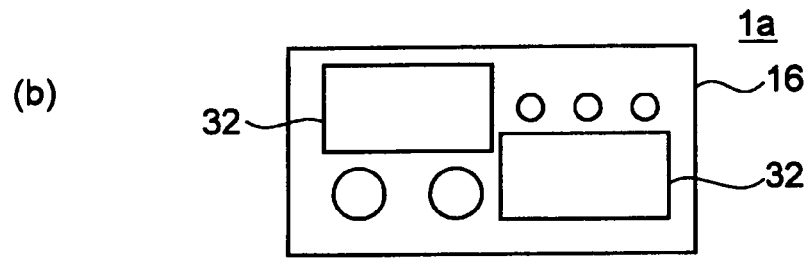
Figure 3A:
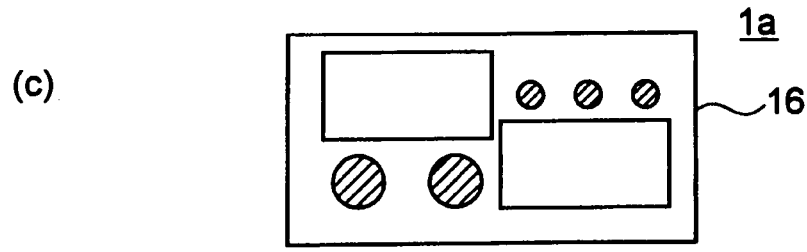
Figure 3A:
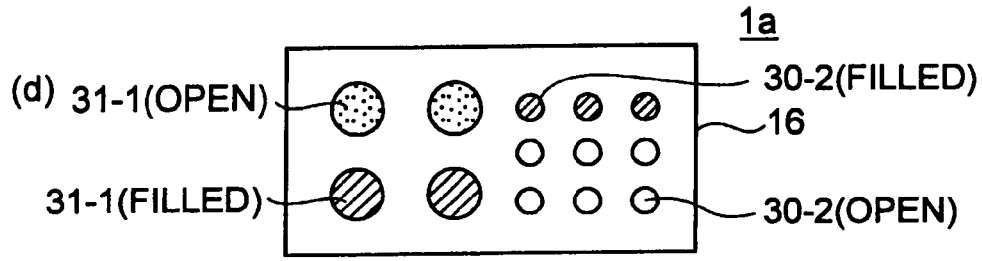
Figure 3B:
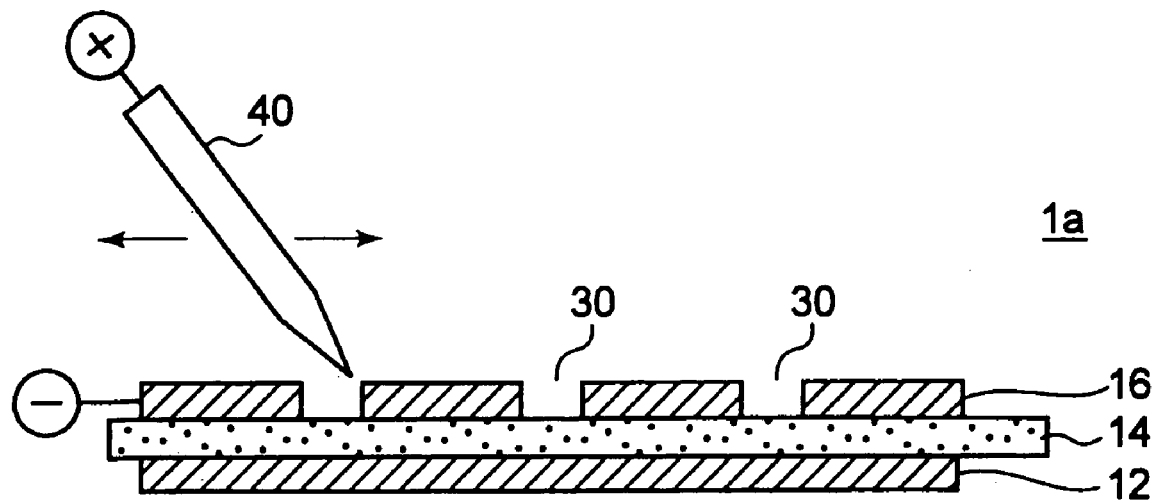
FIG. 3B shows how to fill the openings of the capacitor according to the first embodiment with an electroconductive material using a plating head having a pad impregnated with plating solution.

The openings can be filled with an electroconductive material by, for example, a process of ejecting the electroconductive material to the openings 30-1 and 30-2 using the discharger 60, as illustrated with reference to FIG. 1A (e.g., a dispensing or ink jet process); a sputtering process as illustrated in FIG. 3A; and a process of using a plating head having a pad impregnated with a plating solution, as illustrated in FIG. 3B (e.g., brush plating).

In the sputtering process in FIG. 3A, the upper electrode 16 having predetermined openings 30-1 and 30-2 is formed, and its capacitance is measured (FIG. 3A(a)). Openings to be filled with an electroconductive material are decided, and the other openings are covered with a resist 32 (FIG. 3A(b)). The electroconductive material is applied to the capacitor 1a by sputtering (FIG. 3A(c)). The electroconductive material comprises a metal material and is preferably the same material as the upper electrode 16. The resist is then stripped (FIG. 3A(d)).

The resist material, sputtering conditions, electroconductive material, and other conditions or parameters can be determined with reference typically to procedures, materials, and working conditions generally employed in sputtering process for use in the fabrication of semiconductor substrates or printed wiring boards.

According to the process using brush plating as illustrated in FIG. 3B, the filling is carried out in the following manner: A plating head 40 having a pad impregnated with a plating solution is used as a positive electrode, and the upper electrode 16 of the capacitor 1a is used as a negative electrode. The pad impregnated with a plating solution, e.g., its head, is brought in contact with the periphery of the upper electrode 16 around the opening 30 and held in this state for a predetermined time period to thereby deposit an electrolytic plating component, and the upper electrode 16 extends to the opening 30. Detail of such a plating procedure can be found, for example, in Japanese Patent Laid-open Publication No. 2000-232078, entitled "Method and Apparatus for Plating" published on Aug. 22, 2000.

When the capacitor 1a is formed in a printed wiring board, an interlayer dielectric resin layer or solder resist layer, for example, can be formed over the upper electrode 16 after the formation of the capacitor 1a. The formation of such an additional layer as an interlayer dielectric resin layer or solder resist layer may cause the capacitance of the capacitor 1a to be changed to a small degree. In this case, the capacitance must be adjusted by determining the change in capacitance beforehand using the printed wiring board, and adjusting the capacitance in view of the change.

The capacitor 1a according to the first embodiment has a capacitance adjusted highly precisely by filling the openings in the upper electrode 16 with an electroconductive material to thereby appropriately increase the effective area of the upper electrode 16.

(Advantages or Effects)

The capacitor having an adjustable capacitance according to the first embodiment can have performance with high precision because it is prepared while measuring its capacitance timely. For example, a package substrate which the present inventors intend to develop requires a precision of the capacitance within about ±5%. The embodiment explained in the first embodiment realizes the precision of the capacitance of 99.97%.

After investigations, the present inventors found that the adjustment of the capacitance using laser irradiation disclosed in above-mentioned Japanese Patent Laid-open Publication No. 10-303062 causes following problems: (1) it is relatively difficult to adjust the electrode area with good precision, because heat generated as a result of laser irradiation tends to diffuse; (2) the capacitance may be often affected, because the laser irradiation damages the dielectric layer; and (3) the resin which can have electroconductivity as a result of laser irradiation is not a regular resin and thereby invites increased cost. Likewise, the adjustment of the capacitance using laser irradiation disclosed in above-mentioned Japanese Patent Laid-open Publication No. 2000-340454 may cause the upper electrode to be soft, melted and deformed to thereby come in contact with the lower electrode as a result of heating upon laser irradiation.

In contrast, the capacitor 1a according to the first embodiment is free from these problems caused by laser irradiation, because it does not use laser irradiation in adjustment of its capacitance.

Second Embodiment (Outlines)

Figure 4:
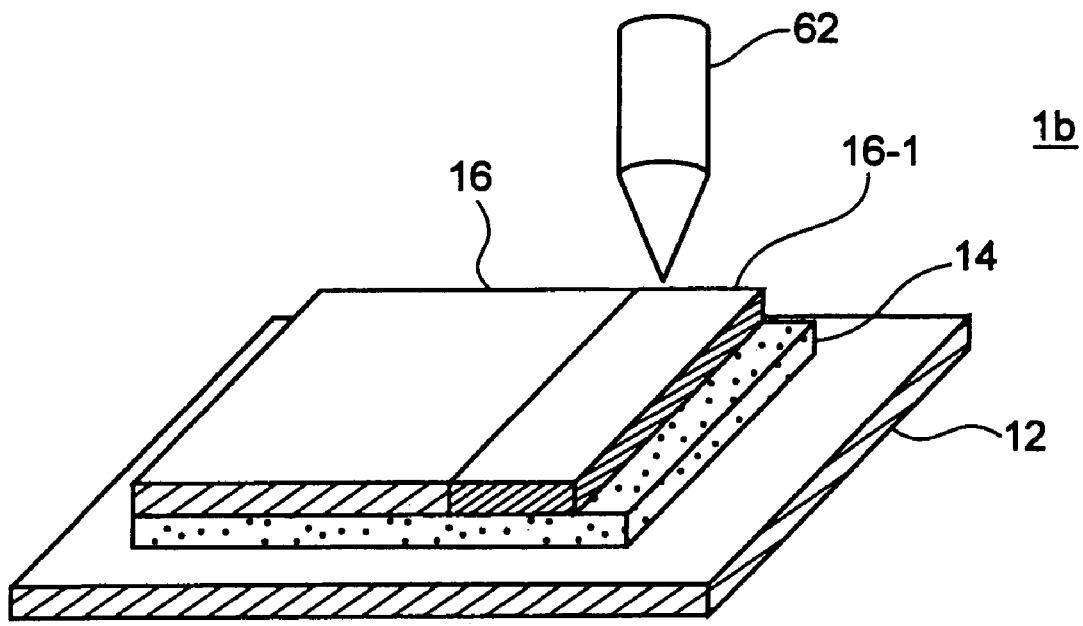
FIG. 4 shows a capacitor having an adjustable capacitance according to a second embodiment of the present invention.

FIG. 4 shows a capacitor 1b having an adjustable capacitance according to a second embodiment. The capacitor 1b comprises an upper electrode 16, a lower electrode 12, and a dielectric layer 14 arranged between the pair of electrodes. The electrodes 16 and 12, and the dielectric layer 14 are same as with those in the capacitor 1a according to the first embodiment.

(Method of Adjusting Capacitance)

According to the capacitor 1b of the second embodiment, the upper electrode 16 is formed to have an apparent electrode area smaller than the area of the lower electrode 12. The upper electrode 16 has an apparent area Sb and an effective area Seff equal to each other because of no opening. The capacitance of the capacitor 1b in this state is measured. Next, an electroconductive material such as a copper (Cu) paste or a silver (Ag) paste is ejected as a discharged electroconductive material 16-1 to an adjacent region of the upper electrode 16 using a discharger 62 to thereby increase the area of the upper electrode 16. The dielectric layer 14 preferably has an area larger than the total area of the upper electrode 16 and the adjacent region 16-1 so as to avoid contact of the discharged electroconductive material 16-1 with the lower electrode 12.

The increasing of the area of upper electrode 16 is carried out by deciding the target capacitance Cspec. of the capacitor 1b beforehand, determining the target area of upper electrode Sa according to Equations (1) and (2), and increasing the area of the upper electrode 16 so that the upper electrode 16 has an area corresponding to the target area Sa, as in the capacitor 1a according to the first embodiment. The increasing of the area of the upper electrode 16 is carried out in one step, or in plural steps while measuring the capacitance. Alternatively, these procedures may be employed in combination.

When a solder resist or interlayer dielectric resin layer is to surround the capacitor 1b, the area of the upper electrode 16 should be increased in view of the change due to the solder resist or interlayer dielectric resin layer, as described in relation to the first embodiment.

The capacitance of the capacitor 1b according to the second embodiment can be adjusted with high precision by applying an electroconductive material using a discharger 62 to the upper electrode 16 to thereby increase the area of the upper electrode 16.

(Advantages and Effects)

The capacitor having the adjustable capacitance according to the second embodiment can have performance with high precision, because the upper electrode is enlarged while measuring its capacitance timely. For example, a precision within about ±5% are required in certain capacitors. The capacitor according to the second embodiment can realize the required high precision.

The conventional techniques for the adjustment of capacitance using laser irradiation disclosed in Japanese Patent Laid-open Publications No. 10-303062 and No. 2000-340454 invite problems, as is described above. In contrast, the capacitor 1b according to the second embodiment is free from these problems caused by laser irradiation, because it does not use laser irradiation for adjusting its capacitance.

[Printed Wiring Board Including Capacitor Having Adjustable Capacitance]

(Configuration)

Figure 5:
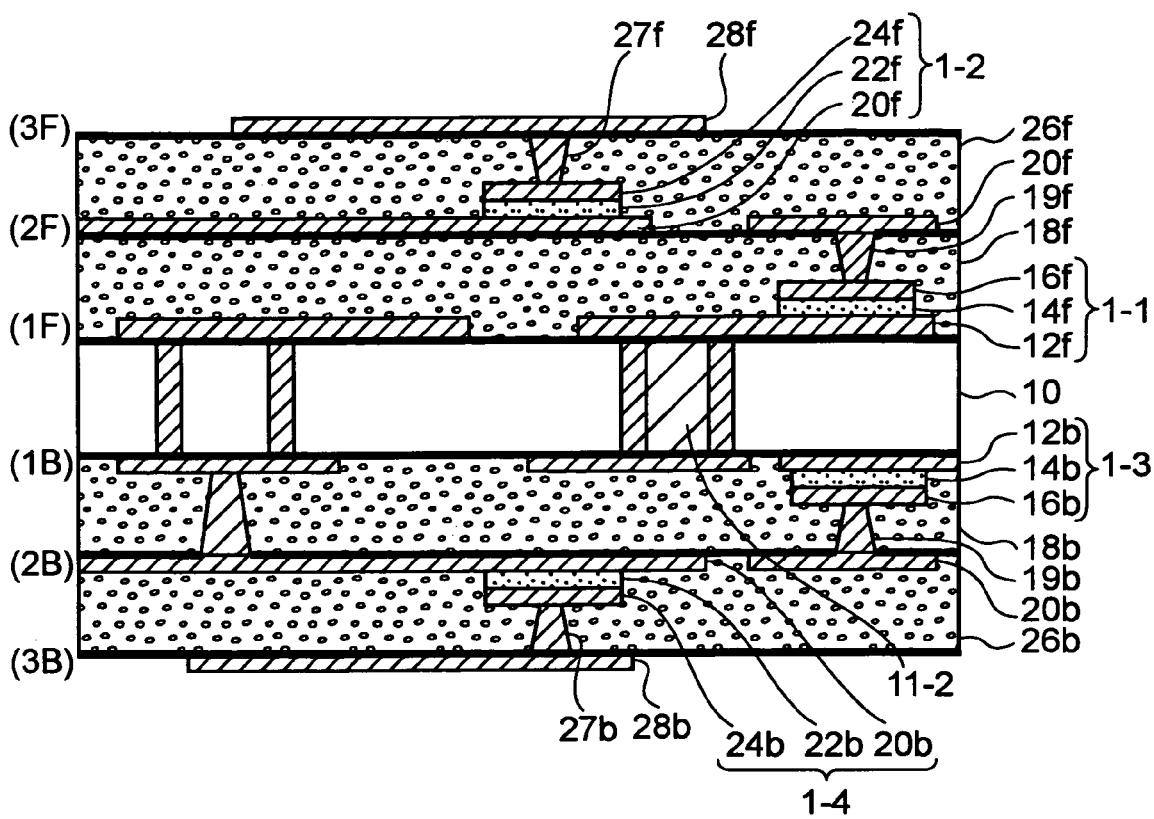
FIG. 5 is a cross-sectional view of a printed wring board, embedded therein a capacitor having the adjustable capacitance according to the first embodiment or the second embodiment.

FIG. 5 is a cross sectional view of a printed wiring board 50 including the capacitors having the adjustable capacitance as illustrated in the first embodiment and the second embodiment. The printed wiring board 50 includes four capacitors 1-1, 1-2, 1-3, and 1-4. The printed wiring board 50 comprises a core layer 10, lower interlayer dielectric resin layers 18f and 18b arranged over both sides of the core layer 10, and upper interlayer dielectric resin layers 26f and 26b arranged on or above the lower interlayer dielectric resin layers 18f and 18b, respectively. The core layer 10 bears circuit conductors 12f and 12b, and includes a through-hole conductor 11-2. The lower interlayer dielectric resin layers 18f and 18b have circuit conductors 20f and 20b and via-hole conductors 19f and 19b, respectively. The upper interlayer dielectric resin layers 26f and 26b have circuit conductors 28f and 28b, and via-hole conductors 27f and 27b, respectively. The conductor layers constituting the multilayer printed wiring board 50 are also called as Layer 3F, Layer 2F, Layer 1F, Layer 1B, Layer 2B, and Layer 3B in this order from the top in FIG. 5.

The capacitors 1-1, 1-2, 1-3, and 1-4 included in printed wiring board 50 each have a capacitance accurately adjusted in their preparation. They function as high-precision capacitors included in the printed wiring board.

(Fabricating Method)

The printed wiring board 50 including capacitors having an adjustable capacitance as shown in FIG. 5 can be fabricated by any of various processes. These processes are roughly classified as through hole plating processes and new-system processes. The new-system processes include, for example, a plating buildup process, an electroconductive paste buildup process, a buildup transfer process, a transfer process, a column plating buildup process, and a laminating process in one pass. Further, the plating processes and buildup processes can be classified by the material and punching procedure as a resin-coated copper foil system, a thermosetting resin system, and a photosensitive insulating system. The fabrication method herein will be briefly illustrated with reference to FIGS. 6A to 6Q by taking a plating buildup process using a thermosetting resin as an example, which process has been relatively frequently employed by the present inventors.

Figure 6A:
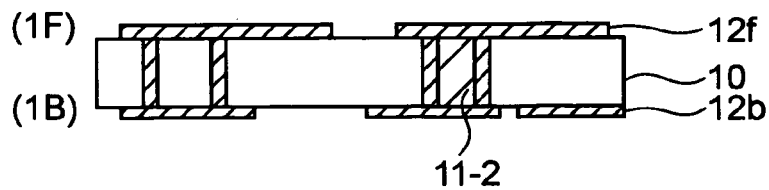
FIGS. 6A to 6Q show a method of fabricating the printed wiring board shown in FIG. 5.

Initially, a core substrate 10 is prepared (FIG. 6A). The core substrate 10 is prepared by a through hole plating process. Specifically, holes are made in a glass fabric-reinforced epoxy resin copper-clad laminate or glass fabric-reinforced high-temperature resin copper-clad laminate, and the side wall and surface of the holes are plated by a through hole plating process to thereby form a through-hole conductor 11-2. The through-hole conductor 11-2 connects the internal and external conductor layers. The through-hole conductor 11-2 may be filled with a copper paste. Thereafter, surface patterns 12f and 12b are formed, and thus the core substrate 10 is prepared. The surface patterns 12f and 12b are conductor layers 1F and 1B, respectively, and part of the surface pattern 12f constitutes a lower electrode of a capacitor 1-1.

Figure 6B:
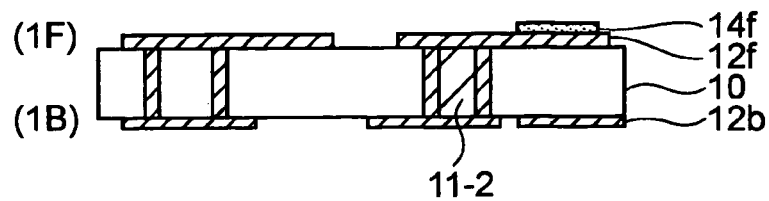

A dielectric layer 14f is formed on part of the surface pattern 12f (FIG. 6B). It is formed, for example, by applying a dielectric laminate or film to the surface pattern 12f, or by printing the pattern with a dielectric material to a predetermined thickness by screen printing. The dielectric layer 14f preferably has a larger area than that of an upper electrode to be prepared in the subsequent step, so as to prevent a short circuit between the upper and lower electrodes.

Figure 6C:
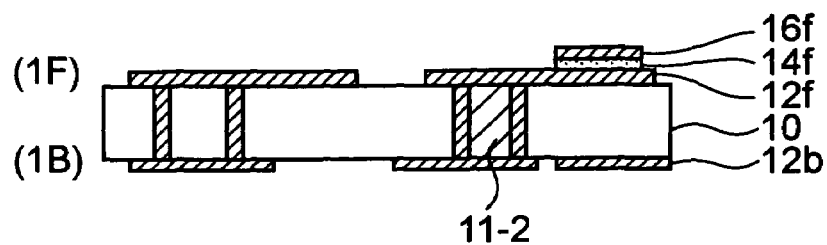

Next, an upper electrode 16f is formed on or above the dielectric layer 14f (FIG. 6C). According to the first embodiment, the upper electrode 16f is formed by a copper foil having predetermined numbers of openings having different sizes, respectively (FIG. 1B); applying the copper foil typically to the dielectric layer 14f in a partially cured state, and drying and curing the dielectric layer 14f. According to the second embodiment, an upper electrode having a relatively small area is prepared. In this stage, the capacitance of the capacitor is adjusted according to the method of adjusting the capacitance, and thus, the built-in capacitor 1-1 is provided.

Figure 6D:
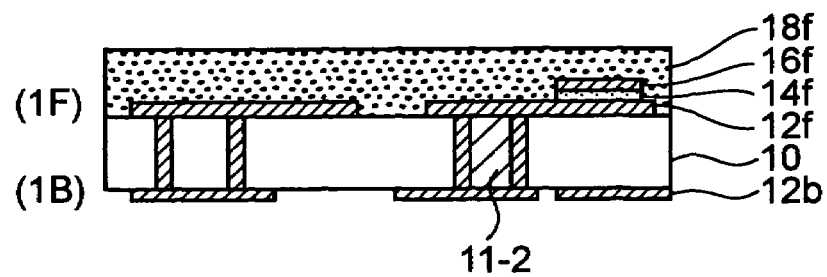

An upper interlayer dielectric resin layer 18f is formed (FIG. 6D). The upper interlayer dielectric resin layer 18f is formed, for example, by applying a partially cured resin sheet or resin film and carrying out thermal curing; or by applying a film of a liquid resin by screen printing, drying and thermally curing the applied film.

Figure 6E:
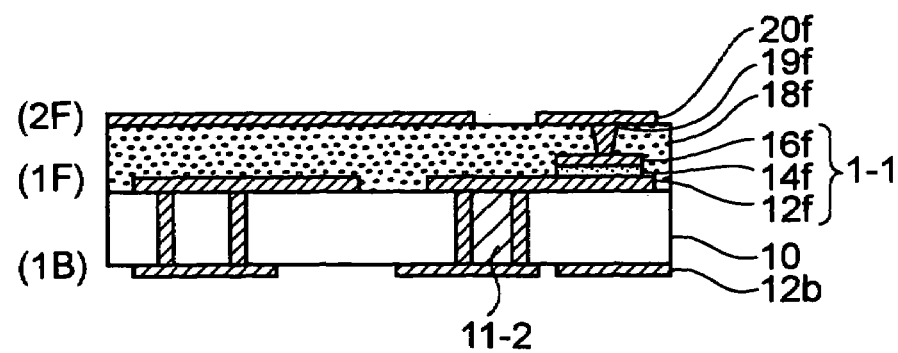

A via-hole 19f and a wiring pattern 20f are formed on the upper interlayer dielectric resin layer 18f (FIG. 6E). They are formed, for example, by forming an opening for via hole in the upper interlayer dielectric resin layer 18f by laser irradiation, and carrying out electroless plating and electrolytic plating. Part of the wiring pattern 20f constitutes a lower electrode of a capacitor 1-2.

Figure 6F:
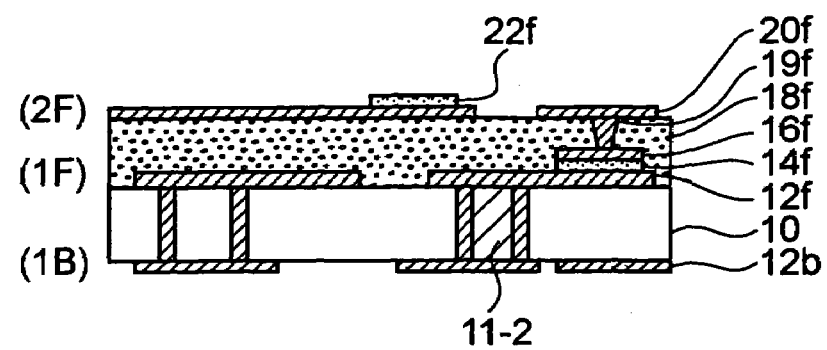
Figure 6G:
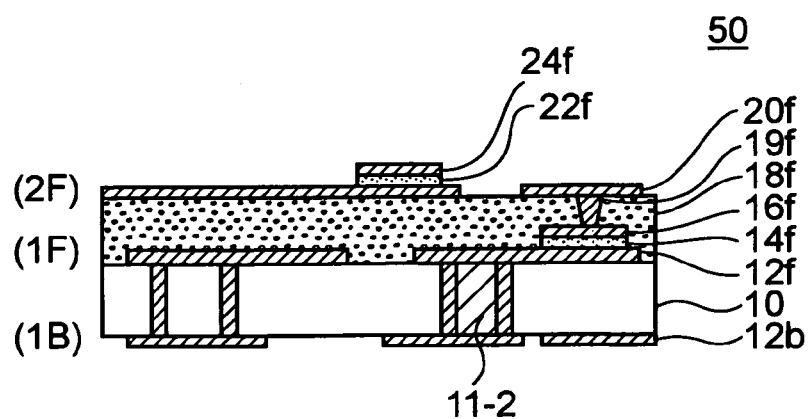
Figure 6H:
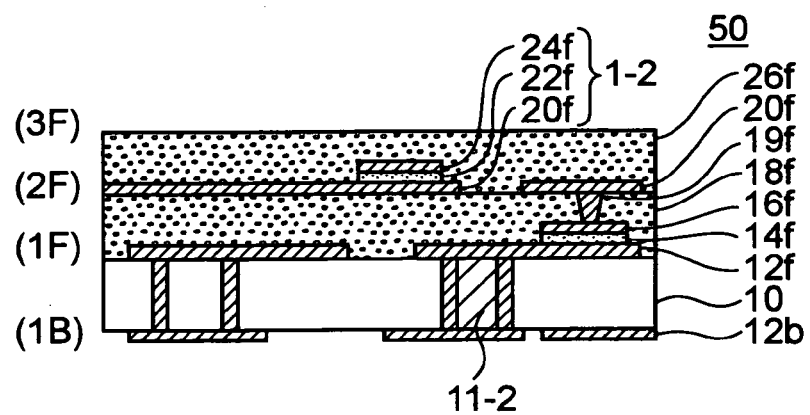
Figure 6I:
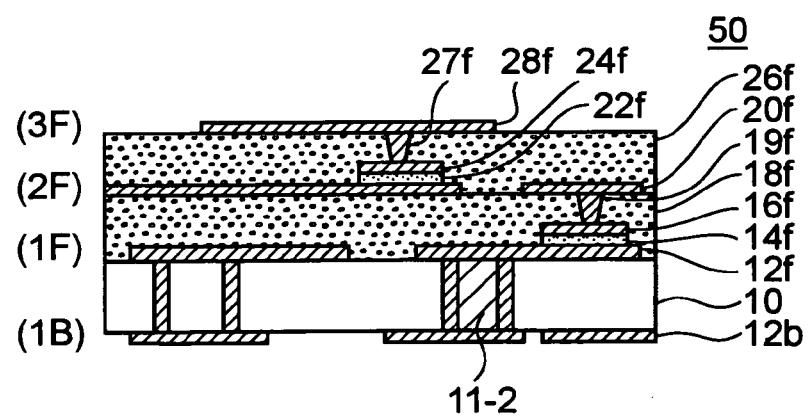

A dielectric layer 22f is formed on part of the surface wiring pattern 20f by the same procedure of FIG. 6B (FIG. 6F). An upper electrode 24f is formed on the dielectric layer 22f by the same procedure of FIG. 6C (FIG. 6G). In this stage, the capacitance of the capacitor is adjusted according to the method of adjusting the capacitance, and thus, the built-in capacitor 1-2 is provided. An upper interlayer dielectric resin layer 26f is then formed by the same procedure of FIG. 6D (FIG. 6H). A via hole 27f and a wiring pattern 28f are formed in or on the upper interlayer dielectric resin layer 26f by the same procedure of FIG. 6F (FIG. 6I).

Figure 6J:
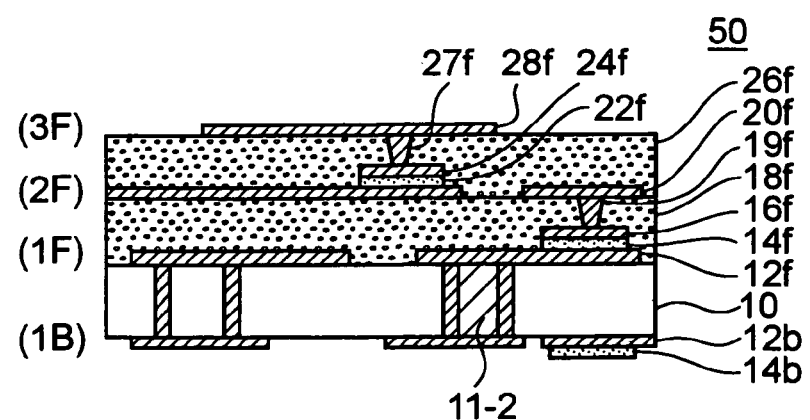
Figure 6K:
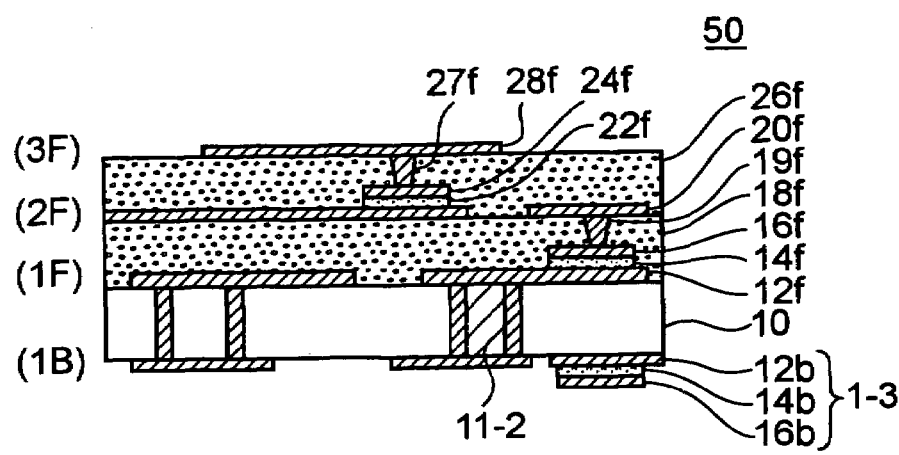
Figure 6L:
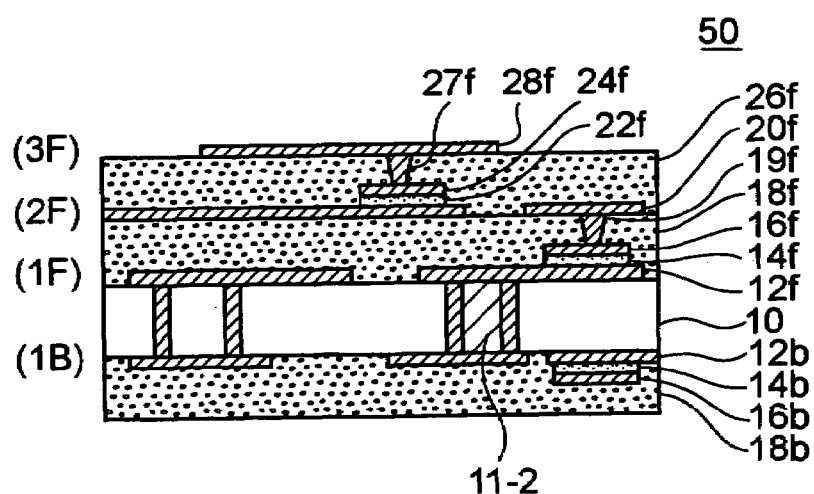
Figure 6M:
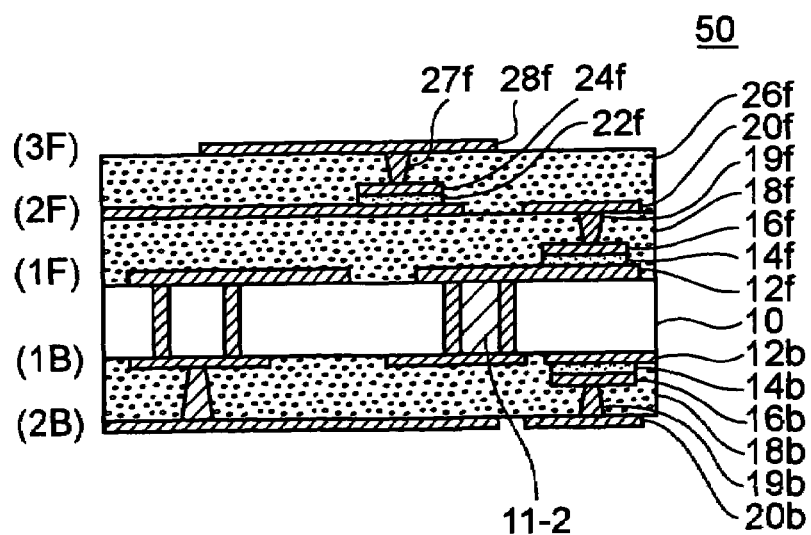

Next, a dielectric layer 14b is formed on part of the surface wiring pattern 12b by the same procedure of FIG. 6B (FIG. 6J). An upper electrode 16b is formed on the dielectric layer 14b by the same procedure of FIG. 6C (FIG. 6K). In this stage, the capacitance of the capacitor is adjusted according to the method of adjusting the capacitance, and thus, the built-in capacitor 1-3 is provided. An upper interlayer dielectric resin layer 18b is formed by the same procedure of FIG. 6D (FIG. 6L). A via hole 19b and a wiring pattern 20b are formed in or on the upper interlayer dielectric resin layer 18b by the same procedure of FIG. 6F (FIG. 6M).

Figure 6N:
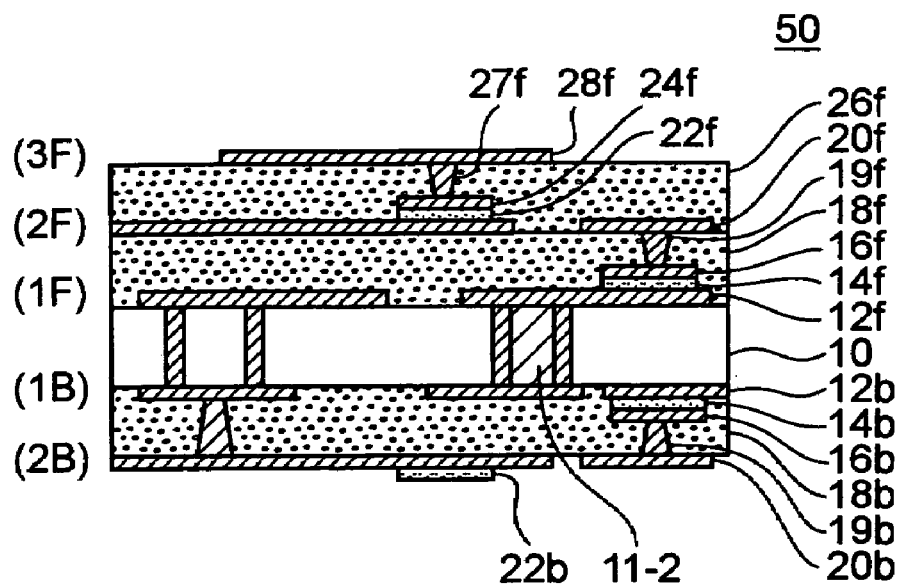
Figure 6O:
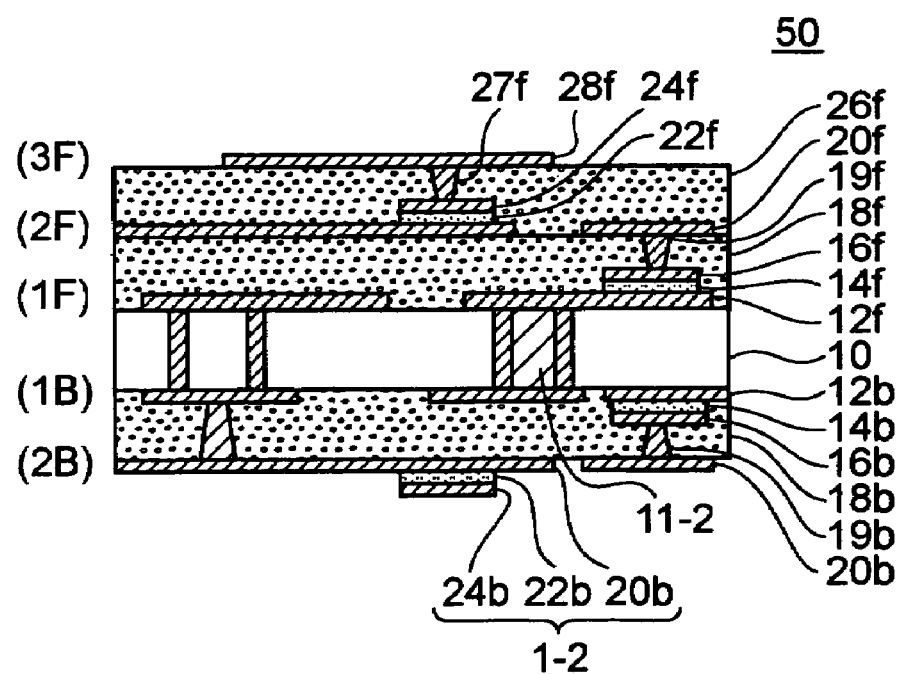
Figure 6P:
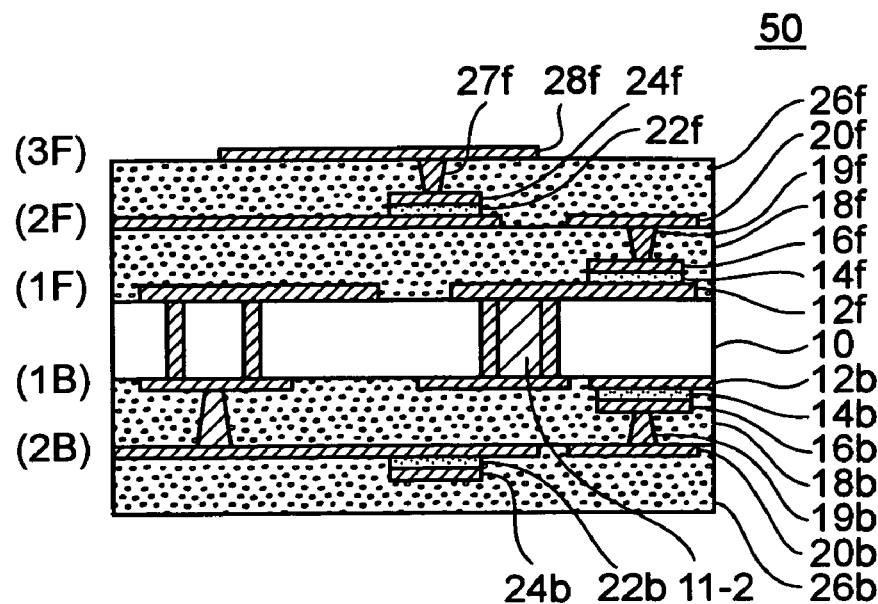
Figure 6Q:
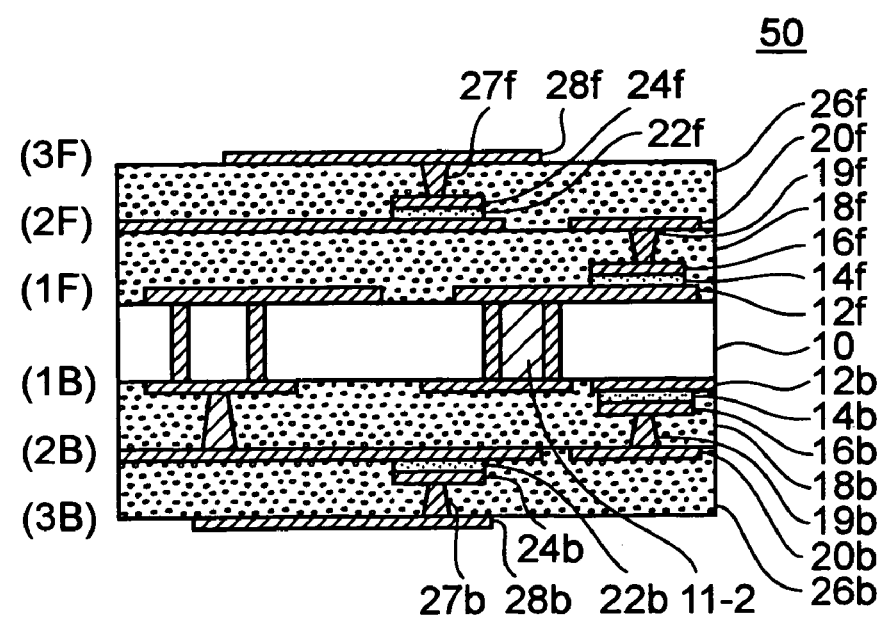

Next, a dielectric layer 22b is formed on part of the surface wiring pattern 20b by the same procedure of FIG. 6G (FIG. 6N). An upper electrode 24b is formed on the dielectric layer 22b by the same procedure of FIG. 6H (FIG. 6O). In this stage, the capacitance of the capacitor is adjusted according to the method of adjusting the capacitance, and thus, the built-in capacitor 1-4 is provided. An upper interlayer dielectric resin layer 26b is formed by the same procedure of FIG. 6I (FIG. 6P). A via hole 27b and a wiring pattern 28b are formed in or on the upper interlayer dielectric resin layer 26b by the same procedure of FIG. 6J (FIG. 6Q).

When the lower interlayer dielectric resin layers 18f and 18b, and the upper interlayer dielectric resin layers 26f and 26b are in plane symmetry with respect to the core substrate 10, respectively, the upper interlayer dielectric resin layers 26f and 26b can be formed concurrently with the lower interlayer dielectric resin layers 18f and 18b.

[Others]

While preferred embodiments of the capacitors having an adjustable capacitance and printed wiring boards including the same according to the invention have been described above, it is to be understood that these are exemplified merely and never intended to limit the scope of the present invention, and that additions, deletions, variations and modifications will be apparent to those skilled in the art without departing the scope and spirit of the invention.

FOR EXAMPLE (1) Upper and lower electrodes of capacitors are named only for the sake of convenience. For example, in the capacitors 1-3 and 1-4 in FIG. 5, electrodes 16*b* and 24*b* illustrated in lower portion of FIG. 5 are upper electrodes, respectively. It should be understood that these are one and the other of a pair of electrodes constituting a capacitor.

(2) The capacitance is adjusted by forming openings in one of the pair of electrodes and filling the openings with an electroconductive material according to First Embodiment; or by preparing one of the pair of electrodes to have a smaller area, and increasing the area of the one electrode by adding an electroconductive material thereto. A broader concept of these is preparing one of the pair of electrodes of the capacitor to have a relatively smaller effective electrode area than the area to achieve the target capacitance, and increasing the effective electrode area with an electroconductive material to thereby allow the capacitance of the capacitor to approach the target capacitance.

The scope of the invention, therefore, is to be determined solely by the following claims.

What is claimed is:

1. A method of adjusting a capacitance of a capacitor including a pair of electrodes, the method comprising:

forming a plurality of openings in one of a pair of electrodes provided in a capacitor such that the openings are grouped into a plurality of groups based on different sizes; and sequentially filling the plurality of openings with an electroconductive material in descending order of the sizes such that a capacitance of the capacitor is adjusted to achieve a target capacitance gradually with an increasing degree of precision.

2. The method of claim 1, wherein the filling is gradually carried out while determining the capacitance of the capacitor.

3. The method of claim 1, wherein the filling comprises measuring the capacitance of the capacitor.

4. The method of claim 1, wherein the filling comprises discharging one of a copper paste and a silver paste into the openings.

5. The method of claim 1, further comprising deciding the target capacitance of the capacitor according to an equation, $C = \epsilon_0 \epsilon_r S/D$, where C represents the capacitance, $\epsilon_0$ represents a dielectric constant of a vacuum, $\epsilon_r$ represents a relative dielectric constant of a dielectric material of the capacitor, S represents an area of the one of the electrodes, and D represents a distance between the electrodes.

6. The method of claim 1, wherein the pair of electrodes comprises an upper electrode and a lower electrode, and the capacitor comprises a dielectric layer formed between the upper electrode and the lower electrode.

7. The method of claim 1, further comprising measuring the capacitance of the capacitor prior to the forming of the openings.

8. The method of claim 1, wherein the pair of electrodes comprises an upper electrode and a lower electrode, the capacitor comprises a dielectric layer formed between the upper electrode and the lower electrode, the lower electrode has a surface area which is larger than a surface area of the dielectric layer, and the dielectric layer has the surface area which is larger than a surface area of the upper electrode.

9. The method of claim 1, wherein the filling comprises increasing an surface area of the one of the electrode in at least one step while measuring the capacitance.

* * * * *